US009679749B2

(12) United States Patent
Angelov et al.

(10) Patent No.: US 9,679,749 B2
(45) Date of Patent: Jun. 13, 2017

(54) GAS DISTRIBUTION DEVICE WITH ACTIVELY COOLED GRID

(71) Applicant: Lam Research Corporation, Fremont, CA (US)

(72) Inventors: Ivelin Angelov, San Jose, CA (US); Serge Kosche, San Francisco, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 428 days.

(21) Appl. No.: 14/498,049

(22) Filed: Sep. 26, 2014

(65) Prior Publication Data

US 2016/0093472 A1    Mar. 31, 2016

(51) Int. Cl.
  *H01J 37/32* (2006.01)
  *C23C 16/44* (2006.01)
  *H01L 21/67* (2006.01)
  *C23C 16/455* (2006.01)

(52) U.S. Cl.
  CPC ...... *H01J 37/3244* (2013.01); *C23C 16/4411* (2013.01); *C23C 16/45572* (2013.01); *H01J 37/32357* (2013.01); *H01J 37/32449* (2013.01); *H01L 21/67069* (2013.01); *H01L 21/67109* (2013.01)

(58) Field of Classification Search
  CPC ............ H01J 37/3244; H01J 37/32357; H01J 37/32449; H01L 21/67109; H01L 21/67069; C23C 16/4411; C23C 16/45572

USPC ......................................................... 118/724
See application file for complete search history.

(56) References Cited

U.S. PATENT DOCUMENTS

| 2004/0219737 A1* | 11/2004 | Quon | H01J 37/321 438/222 |
| 2009/0200948 A1* | 8/2009 | Selwyn | H01J 37/32082 315/111.21 |
| 2010/0078320 A1* | 4/2010 | Stowell | C23C 16/511 204/298.07 |
| 2014/0004707 A1 | 1/2014 | Thedjoisworo et al. | |
| 2016/0093472 A1* | 3/2016 | Angelov | H01J 37/3244 156/345.34 |

* cited by examiner

*Primary Examiner* — Jeffrie R Lund (57) ABSTRACT

A grid assembly for a substrate processing system includes a first portion including a first body defining a central opening, an inlet, an outlet, and an upper manifold that is located in the first body and that is in fluid communication with the inlet or the outlet. A second portion is arranged adjacent to the first portion and includes a second body defining a central opening. A plurality of tubes is arranged in the central opening of the second body. First ones of the plurality of tubes are in fluid communication with the upper manifold. A lower manifold is located in the second body and is in fluid communication with the other one of the inlet or the outlet. Second ones of the plurality of tubes are in fluid communication with the lower manifold. The grid assembly is arranged between a remote plasma source and a substrate.

35 Claims, 7 Drawing Sheets

GAS DISTRIBUTION DEVICE WITH ACTIVELY COOLED GRID

FIELD

The present disclosure relates to substrate processing systems, and more particularly to substrate processing systems including a gas distribution device with an actively cooled grid.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are typically used to pattern, deposit, etch and ash various types of film on a substrate such as a semiconductor wafer. The substrate processing systems typically include a processing chamber with a substrate support such as a pedestal, an electrostatic chuck, a plate, etc. A substrate such as a semiconductor wafer may be arranged on the substrate support.

In chemical vapor deposition (CVD) or atomic layer deposition (ALD) processes, a gas mixture including one or more precursors may be introduced into the processing chamber to deposit a film on the substrate. In some substrate processing systems, radio frequency (RF) plasma may be used to activate chemical reactions. The RF plasma may be delivered remotely to the processing chamber through a gas distribution device or created directly in the processing chamber.

For example during processing, a photoresist layer may be used to define features in the film. Afterwards, the photoresist layer is typically removed. Ashing may be used to remove the photoresist layer. Ashing may be performed using a remote plasma source. The remote plasma source typically generates the plasma by exciting a reactive gas such as oxygen or fluorine using a radio frequency or microwave signal.

A gas distribution device such as a showerhead may be arranged between the remote plasma source and the substrate. The showerhead may include a plate made of aluminum that includes a plurality of holes defining a hole pattern. The hole pattern in the plate may extend approximately to an edge of the underlying substrate. The holes act as an ion filter. During use, heat in the plate tends to increase due to recombination of ions in the holes.

As the substrates increase in size and area, the amount of RF power supplied by the remote plasma source typically needs to increase to maintain a desired ash rate for the larger substrate. At the higher RF power levels, heating of the plate increases to an unacceptable temperature. While brazed showerhead designs allow water cooling to lower the temperature of the plate, they tend to have relatively low reliability. Gun drilled showerhead designs also allow water cooling to lower the temperature of the plate but are costly to manufacture.

SUMMARY

A grid assembly for a substrate processing system includes a first portion including a first body defining a central opening, an inlet, an outlet, and an upper manifold that is located in the first body and that is in fluid communication with the inlet or the outlet. A second portion is arranged adjacent to the first portion and includes a second body defining a central opening. A plurality of tubes is arranged in the central opening of the second body. First ones of the plurality of tubes are in fluid communication with the upper manifold. A lower manifold is located in the second body and is in fluid communication with the other one of the inlet or the outlet. Second ones of the plurality of tubes are in fluid communication with the lower manifold. The grid assembly is arranged between a remote plasma source and a substrate.

In other features, the first body and the second body are annular-shaped. The plurality of tubes is arranged in parallel in the central opening of the second portion. The upper manifold includes a bottom surface with a plurality of first holes in fluid communication with a plurality of second holes in the first ones of the plurality of tubes, respectively. An O-ring is arranged on a bottom surface of the first body around the plurality of first holes to provide a seal between the bottom surface of the first body and an upper surface of the second body.

In other features, the second portion includes a plurality of first holes in an outer circumferential side surface of the second body. The plurality of tubes are arranged in the first holes.

In other features, first plugs are arranged in the first ones of the plurality of tubes. Second plugs are arranged in the second ones of the plurality of tubes. The second plugs have a different length than the first plugs.

In other features, a hole through the first body is in fluid communication with the other one of the inlet or the outlet. The hole is also in fluid communication with the lower manifold. An O-ring is arranged on a bottom surface of the first body around the hole to provide a seal between the bottom surface of the first body and an upper surface of the second body.

In other features, S upper manifolds are defined in the first body. The S upper manifolds include the upper manifold, where S is an integer greater than one. T lower manifolds are defined in the second body. The T lower manifolds include the lower manifold, where T is an integer greater than one.

In other features, one-half of the S upper manifolds are located on one side of the first body. One-half of the S upper manifolds are located on an opposite side of the first body. One-half of the T lower manifolds are located on one side of the second body. One-half of the T lower manifolds are located on an opposite side of the second body.

In other features, a substrate processing system includes the grid assembly and a faceplate that includes a hole pattern including a plurality of holes and that is arranged adjacent to the lower portion of the grid assembly.

In other features, the plurality of tubes of the grid assembly is made of aluminum and the faceplate is made of quartz. The plurality of tubes has a circular cross-section. The plurality of tubes has an elliptical cross-section. The elliptical cross-section has a minor axis that is parallel to a plane including the plurality of tubes.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A gas distribution device according to the present disclosure includes a grid assembly including an upper portion, a lower portion and a plurality of tubes. The plurality of tubes isolates the plasma from the substrate while filtering unwanted and damaging ions. In some examples, the grid assembly is electrically grounded and traps the ions to prevent damage to the substrate. The grid assembly may be cooled by cooling fluid flowing through the tubes to prevent melting. For example only, the cooling fluid may include water, Galden™ or other suitable cooling fluid.

In some examples, the tubes of the grid assembly are arranged in parallel in a plane parallel to and above a showerhead faceplate or in an intersecting pattern. If used, the faceplate may be arranged below the grid assembly. In addition, the tube pattern can be combined with another grid assembly located above or below the grid assembly. The pattern of the grid assembly may also be used in combination with a showerhead pattern to provide additional gas distribution.

As can be appreciated, the gas distribution device with the cooled grid assembly may be used in any substrate processing system. For example only, the gas distribution device with the cooled grid assembly may be used in substrate processing systems used to pattern, deposit, etch and ash film on a substrate such as a semiconductor wafer.

Figure 1:
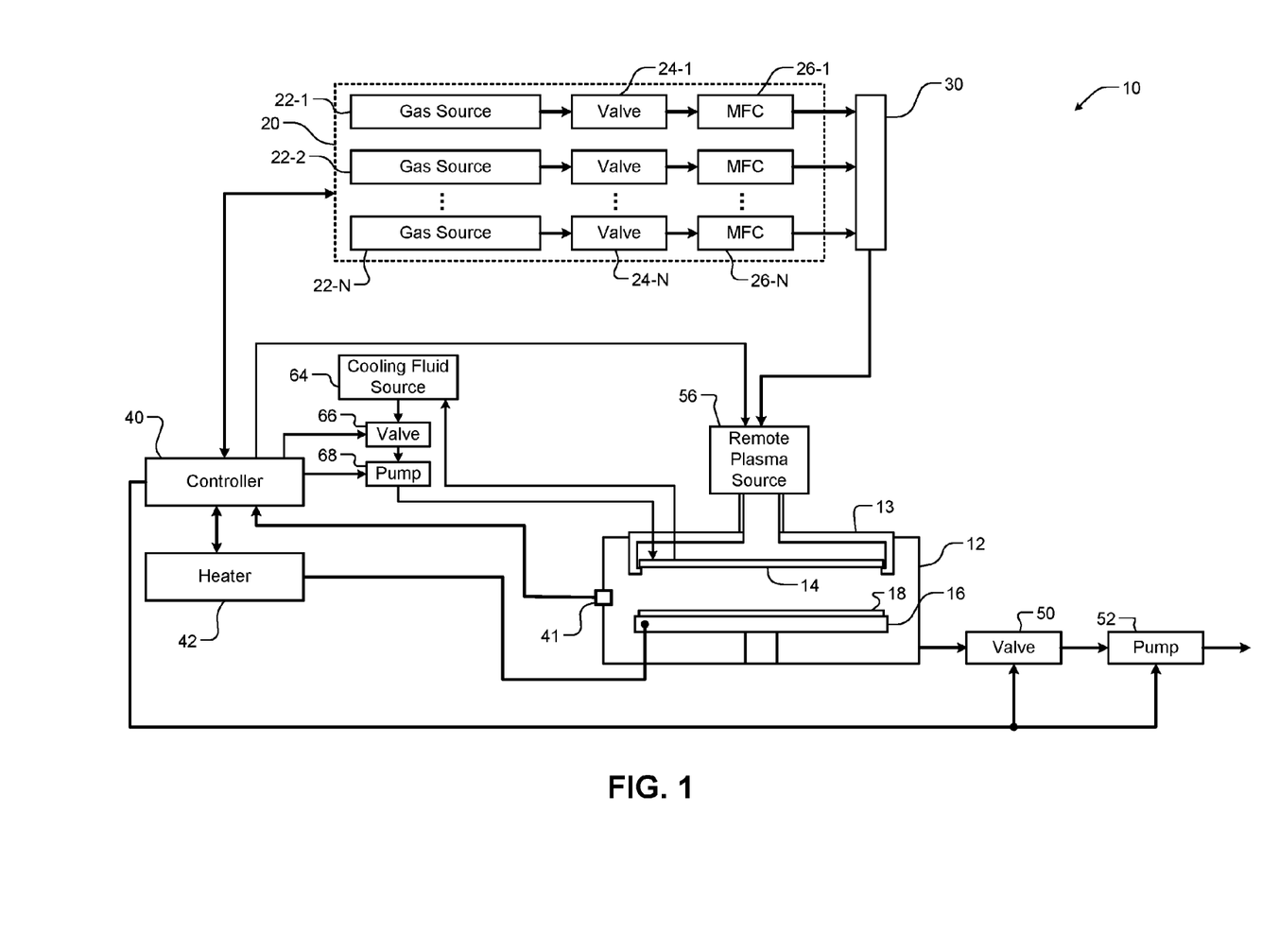
FIG. 1 is a functional block diagram of an example of a substrate processing system according to the present disclosure.

Referring now to FIG. 1, an example of a substrate processing system 10 according to the present disclosure is shown. The substrate processing system 10 includes a process chamber 12 and a gas distribution device 13 including a grid assembly 14. In some examples, remote plasma may be supplied to or created in the gas distribution device 13 as will be described further below. A pedestal 16 may be arranged in the process chamber 12. During use, a substrate 18 such as a semiconductor wafer or other type of substrate may be arranged on the pedestal 16.

The substrate processing system 10 includes a gas delivery system 20. For example only, the gas delivery system 20 may include one or more gas sources 22-1, 22-2, . . . , and 22-N (collectively gas sources 22) where N is an integer greater than zero, valves 24-1, 24-2, . . . , and 24-N (collectively valves 24), and mass flow controllers (MFC) 26-1, 26-2, . . . , and 26-N (collectively MFC 26). Outputs of the gas delivery system 20 may be mixed in a manifold 30 and delivered to the remote plasma source and/or to the gas distribution device 13.

A controller 40 may be connected to one or more sensors 41 that monitor operating parameters in the process chamber 12 such as temperature, pressure, etc. A heater 42 may be provided to heat the pedestal 16 and the substrate 18 as needed. A valve 50 and pump 52 may be provided to evacuate gas from the process chamber 12.

For example only, the remote plasma source 56 may include a plasma tube, an inductive coil or another device to create the remote plasma. For example only, a remote plasma source 56 may use RF or microwave power to create remote plasma using reactive gas such as but not limited to oxygen, fluorine, gas mixtures including oxygen and/or fluorine, and/or other reactive gases. In some examples, an inductive coil is wound around an upper stem portion of a showerhead and is excited by an RF signal generated by an RF source and a matching network. Reactive gas flowing through the stem portion is excited into a plasma state by the RF signal passing though the inductive coil.

The controller 40 may be used to control the gas delivery system 20, the heater 42, the valve 50, the pump 52, and plasma generated by the remote plasma source 56.

In some examples, a cooling fluid source 64 provides cooling fluid to a valve 66 and a pump 68 in fluid communication with fluid inlets of the grid assembly 14. After circulation, the fluid may be returned via fluid outlets to the cooling fluid source 64. While the valve 66 and pump 68 are arranged on the inlet side of the grid assembly 14, the valve 66 and pump 68 may be arranged on the outlet side of the grid assembly 14 as well.

Figure 2:
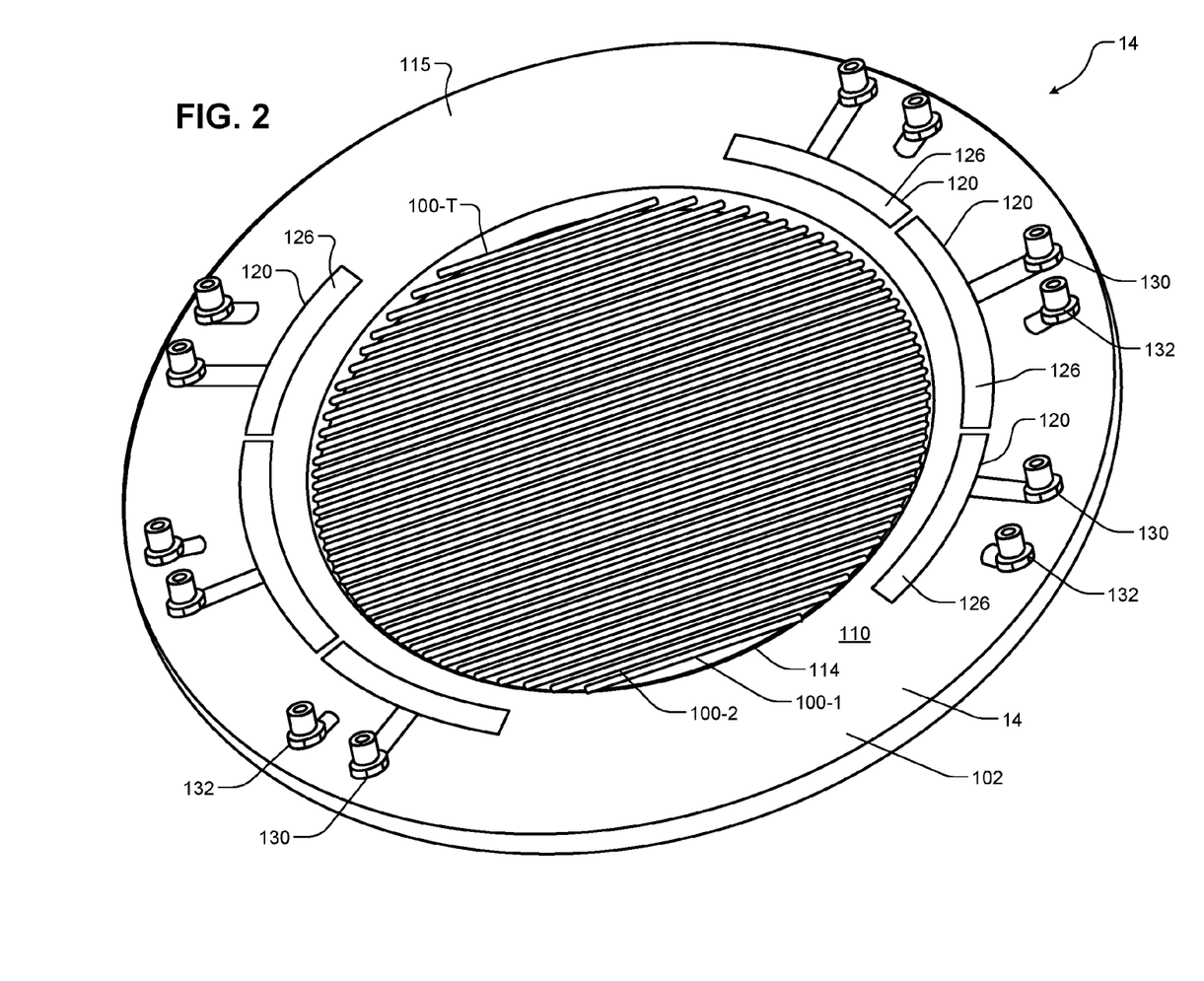
FIG. 2 is a perspective view of an example of a grid assembly according to the present disclosure.

Referring now to FIG. 2, a perspective view of an example of the grid assembly 14 according to the present disclosure is shown. The grid assembly 14 includes a plurality of tubes 100-1, 100-2, . . . , and 100-T (collectively tubes 100), an upper portion 102, and a lower portion (shown in FIGS. 3, 6 and 7). In some examples, the tubes 100, the upper portion 102, and/or the lower portion can be made of aluminum. In some examples, the tubes 100 are seamless and have a circular, elliptical or another cross-section. A faceplate (shown in FIGS. 3 and 8) including a pattern of holes may be arranged parallel to and below the grid assembly 14. In some examples, the faceplate is made of quartz.

The upper portion 102 may be generally annular shaped and may include an upper surface 110 defining a central opening 114. The tubes 100 may be arranged in a parallel manner in a plane located in the central opening 114. The upper portion 102 includes a body 115 defining one or more manifolds 120 for receiving a cooling fluid. The manifolds 120 may be enclosed by a manifold cover 126.

Fluid inlets 130 are in fluid communication with the manifolds 120. Fluid outlets 132 are in fluid communication with manifolds that are associated with the lower portion as will be described further below. Alternately, the fluid inlets may be associated with the lower portion and the fluid outlets may be associated with the upper portion. Furthermore, the manifolds in the upper portion may alternate between inlets and outlets. The number of manifolds defined by the upper portion does not need to be the same as the number of manifolds defined by the lower portion. In some examples, M manifolds 120 are arranged on opposite sides of the body 115, where M is an integer greater than zero. In the example in FIG. 3, M=3 and there are a total of 6 manifolds 120. The lower portion may have a similar layout.

In this example arrangement, fluid is provided and removed from both sides to provide an isothermal design. Still other variations are contemplated.

Figure 3:
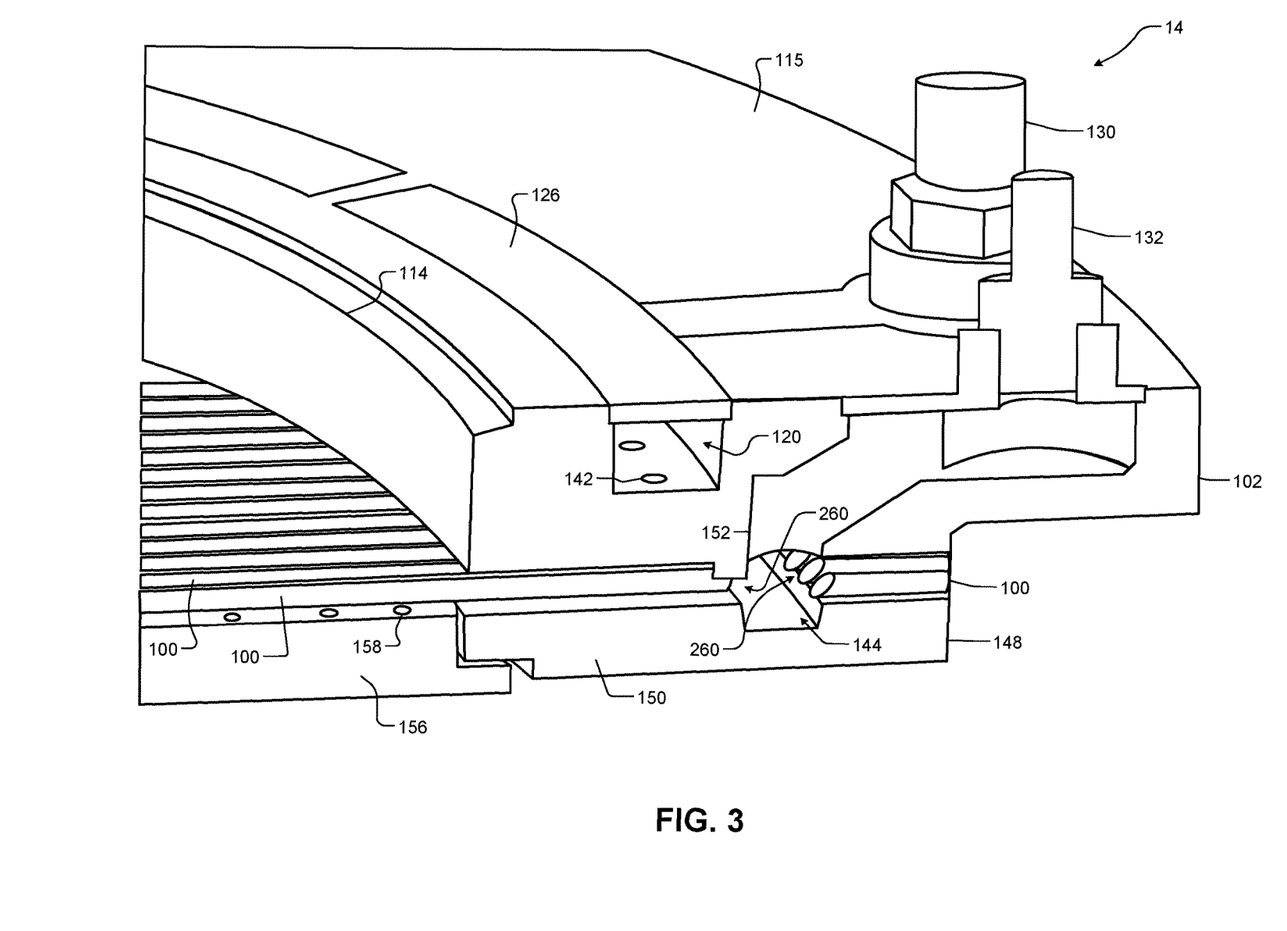
FIG. 3 is a perspective, cutaway view of an example of the grid assembly and a faceplate.

Referring now to FIG. 3, the grid assembly 14 may be arranged adjacent to a faceplate 156. Cooling fluid may be supplied via one of the fluid inlets 130 to one of the manifolds 120. The cooling fluid flows through holes 142 in a bottom surface of the manifolds 120 and into selected ones of the tubes 100. The cooling fluid (originating from manifolds 120 on an opposite side of the body 115) flows through the tubes 100 and into manifolds 144 defined by a body of a lower portion 148.

Fluid in one of the manifolds 144 is shown flowing through an opening 152 in the upper portion 102 and into one of the fluid outlets 132. As can be appreciated, flow of the cooling fluid may be reversed. A faceplate 156 including a pattern of holes 158 may be arranged below the tubes 100 and/or the lower portion 148. In some examples, the faceplate 156 is made of quartz.

Figures 4, 5:
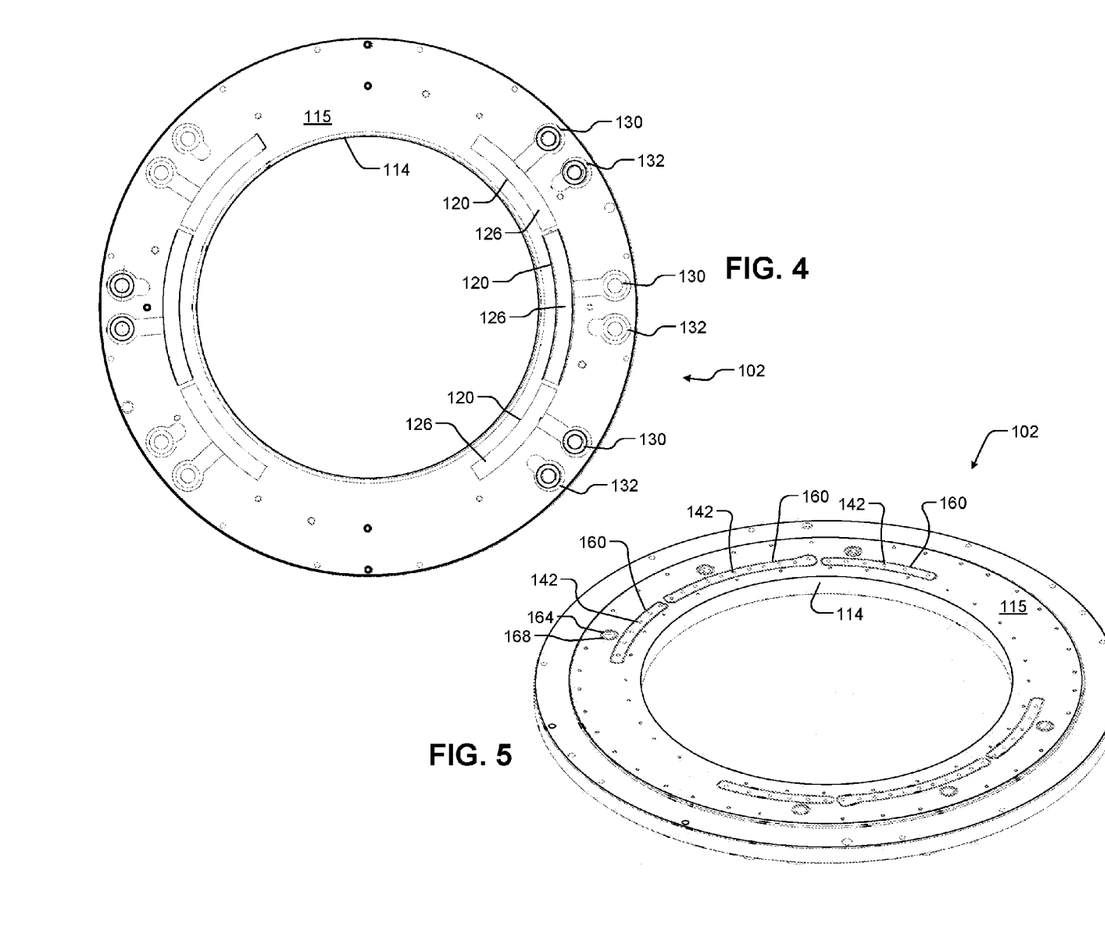
FIG. 4 is a plan view of a top surface of an example of an upper portion of the grid assembly.
FIG. 5 is a perspective view of a bottom surface of the upper portion of FIG. 4.

Referring now to FIGS. 4-5, top and bottom surfaces of an example of the upper portion 102 are shown, respectively. The holes 142 pass through a bottom surface of the body 115 to the inside of the manifolds 120 and provide a fluid path from the manifolds 120 to the tubes 100 as shown in FIGS. 3 and 5. One or more O-rings 160 may be used around the holes 142 to provide a seal between the bottom surface of the upper portion 102 and an upper surface of the lower portion 148. Likewise, holes 164 associated with the fluid outlets 132 may employ an O-ring 168 to provide a seal between the bottom surface of the upper portion 102 and the upper surface of the lower portion 148.

Figure 6A:
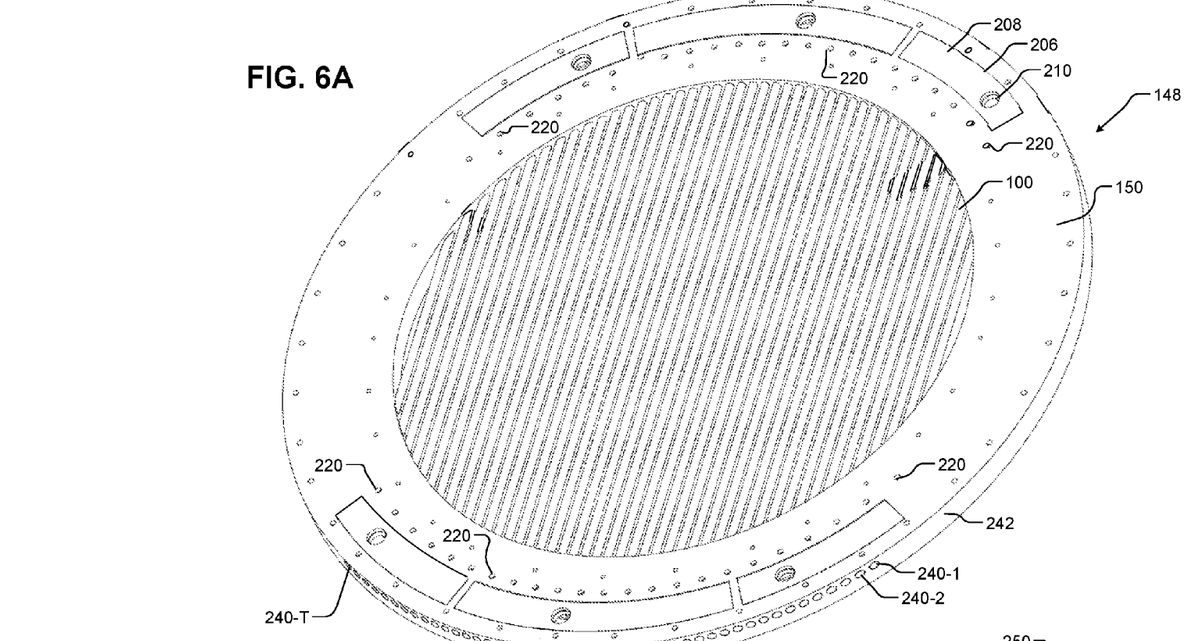
FIG. 6A is a plan view of a top surface of an example of a lower portion of the grid assembly.
Figure 6B:
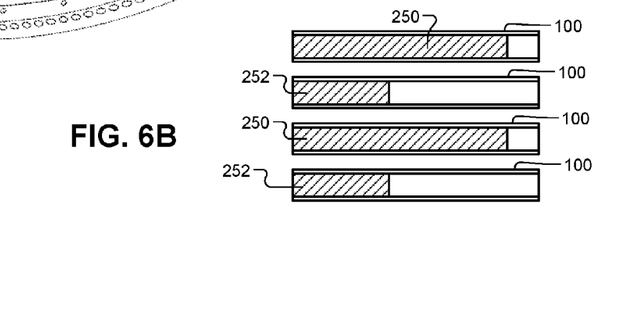
FIG. 6B is a cross-sectional view of an example of the tubes.

Referring now to FIGS. 6A-6B, an example of the lower portion 148 is shown. In FIG. 6A, the lower portion 148 includes the body 150, may be generally annular shaped and may define one or more manifolds 206. Manifold covers 208 may be used to enclose the manifolds 206. Openings 210 in the manifold covers 208 may be aligned with the openings 164 in the upper portion 102 to allow the cooling fluid to the fluid outlets 132.

In some examples, a plurality of holes 240-1, 240-2, ..., and 240-T (collectively holes 240) may be made in an outer circumferential side surface 242 of the lower portion 148. The tubes 100 may be inserted into the holes 240 and pass through the manifolds 206. In some examples, first plugs 250 having a first length and second plugs 252 having a second length may be inserted into alternating ones of the tubes 100 as shown in FIG. 6B. The first plugs 250 may be longer than the second plugs 252. The plugs 250 and 252 are used to seal ends of the tubes 100.

Figure 7:
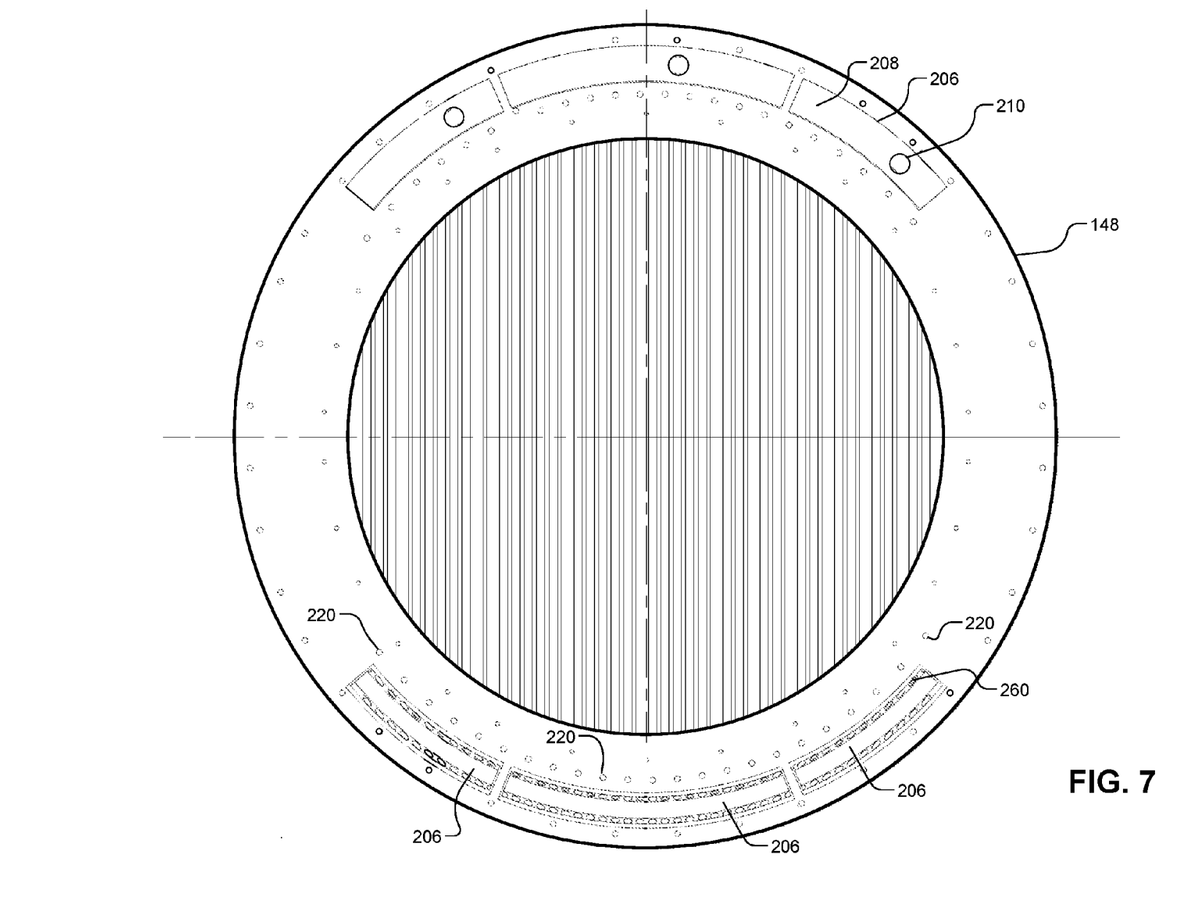
FIG. 7 is a perspective view of a bottom surface of the lower portion of FIG. 6.

Referring to FIGS. 3 and 7, an example method for assembling the lower portion 148 will be described. The tubes 100 are inserted through the holes 240 in the lower portion 148. The plugs 250 and 252 are inserted into the ends of the tubes 100 as described above. With the manifold covers 208 removed, the tubes 100 are cut in an area inside of the manifolds 206 as can be seen in FIGS. 3 and 7 at 260. After cutting, one end of the tubes 100 with the second plugs 252 is in fluid communication with the manifolds 206 of the lower portion 148. In contrast, both ends of the tubes associated with the first plugs 250 remain blocked and are not in direct fluid communication with the corresponding manifold 206 of the lower portion 148. Instead, the tubes 100 associated with the first plugs 250 are drilled and communicate with the holes 142 to provide a fluid path from the manifolds 120 to the tubes 100 associated with the first plugs 250.

Figure 8A:
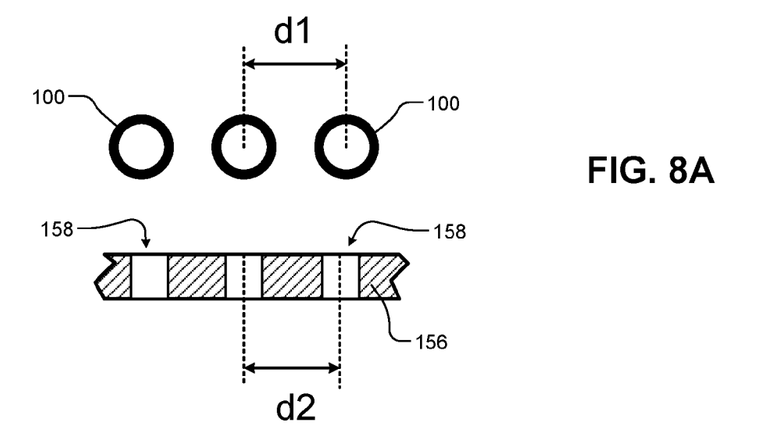
FIGS. 8A and 8B illustrate example of tubes and spacing of tubes relative to holes in the faceplate.
Figure 8B:
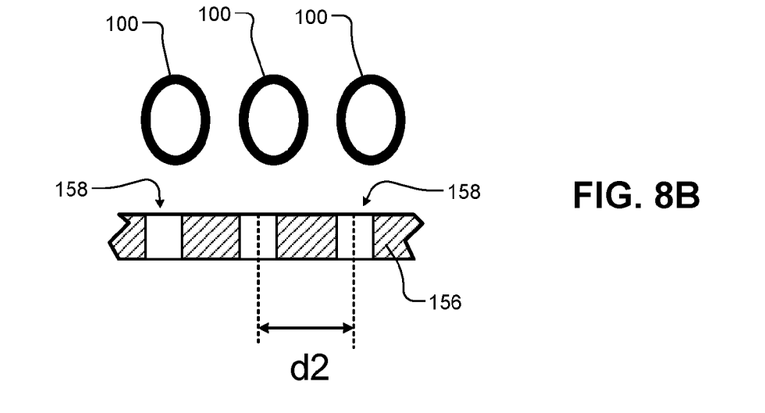

Referring now to FIG. 8A, an example of spacing of tubes relative to holes in the faceplate are shown. In this example, the tubes 100 have a diameter of 0.25" and are spaced at 0.375" on center as shown at d1, although other dimensions may be used. In this example, the faceplate holes are 0.25" in diameter and are spaced 0.350" on center as shown at d2, although other dimensions may be used. In FIG. 8B, an example using elliptical tubes is shown. In some examples, the grid assembly may include tubes having two or more tube diameters, two or more tube shapes or two or more tube spacing dimensions.

Figure 9:
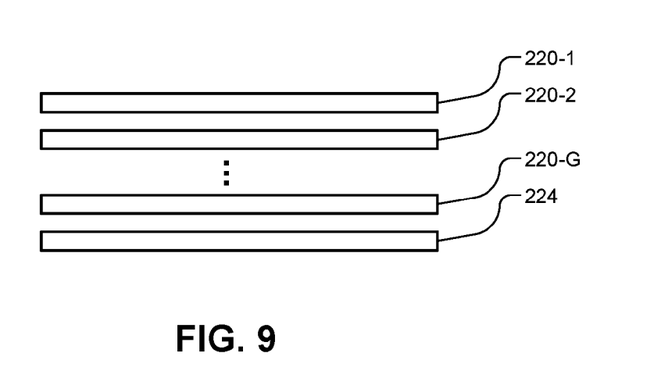
FIG. 9 illustrates an example of multiple cooled grid assemblies arranged above a faceplate.

Referring now to FIG. 9, an example of multiple cooled grid assemblies 220-1, 220-2, . . . , and 220-G (collective cooled grid assemblies 220) is shown, where G is an integer greater than 1. The cooled grid assemblies 220 are arranged above a faceplate 224. The cooled grid assemblies 220 may be arranged in alignment with one another or rotated relative to one another. Alternately, each of the cooled grid assemblies 220 may have different tube spacing and/or diameters and may be arranged in alignment with one another or rotated relative to one another.

As the grid assembly is heated by the plasma, the cooling fluid cools the tubes. The spacing of the grid pattern acts as an ion filter to protect the substrate from damage and improves the uniformity of gas distribution.

When processing substrate having an increased diameter, significant additional plasma power is needed to ash the substrate. Typically, plasma power increases with the area of the substrate. For examples increasing substrate diameter from 300 mm to 450 mm (a 2.25× increase in area) requires a similar increase in plasma power. For example, the plasma power may need to increase from 5 kW to 12.5 kW. The temperature of the faceplate increases with plasma power. A typical maximum operating temperature for the faceplate may be 300° C. The cooled grid assembly allows the increase in plasma power without exceeding the faceplate maximum operating temperature. In some examples, the cooled grid assembly reduces the temperature of the faceplate on the order of approximately 50° C. to over 200° C.

In simulations, the actively cooled grid assembly in combination with a quartz faceplate has been shown to have similar ash rates (approximately 18%) as brazed showerhead designs and gun drilled showerhead designs.

In some examples, the tubes are coated with an electrically conducting material that has a low recombination coefficient for the neutrals in the plasma. In some examples, the cross section of the tubes is circular, square, polygonal with three or more sides, or elliptical. Elliptical tubes will increase the aspect ratio of the space between adjacent tubes to more effectively remove ions that are heading toward the faceplate. The energetic ions hit and stick to the tubes, whereas the neutrals bounce off of the tubes and eventually travel to the faceplate below.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer substrate support, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A cooling grid assembly for a substrate processing system, comprising:
    a first portion including:
        a first body defining a central opening;
        an inlet;
        an outlet; and
        an upper manifold that is located in the first body and that is in fluid communication with the inlet or the outlet; and
    a second portion arranged adjacent to the first portion and including:
        a second body defining a central opening;
        a plurality of tubes arranged in the central opening of the second body, wherein first ends of each of the plurality of tubes are in fluid communication with the upper manifold; and
        a lower manifold that is located in the second body and that is in fluid communication with the other one of the inlet or the outlet,
        wherein second ends of each of the plurality of tubes are in fluid communication with the lower manifold, and
        wherein the grid assembly is arranged between a remote plasma source and a substrate.

2. A cooling grid assembly of claim 1, wherein the first body and the second body are annular-shaped and wherein the plurality of tubes is arranged in parallel in the central opening of the second portion.

3. A cooling grid assembly of claim 1, wherein the upper manifold includes a bottom surface with a plurality of first holes in fluid communication with a plurality of second holes in the first ones of the plurality of tubes, respectively.

4. A cooling grid assembly of claim 3, further comprising an O-ring arranged on a bottom surface of the first body around the plurality of first holes to provide a seal between the bottom surface of the first body and an upper surface of the second body.

5. A cooling grid assembly of claim 1, wherein the second portion includes a plurality of first holes in an outer circumferential side surface of the second body, and wherein the plurality of tubes are arranged in the first holes.

6. A cooling grid assembly of claim 5, further comprising:
first plugs arranged in the first ones of the plurality of tubes; and
second plugs arranged in the second ones of the plurality of tubes, wherein the second plugs have a different length than the first plugs.

7. A cooling grid assembly of claim 1, further comprising:
a hole through the first body that is in fluid communication with the other one of the inlet or the outlet, wherein the hole is also in fluid communication with the lower manifold; and
an O-ring arranged on a bottom surface of the first body around the hole to provide a seal between the bottom surface of the first body and an upper surface of the second body.

8. A cooling grid assembly of claim 1, further comprising:
S upper manifolds defined in the first body, wherein the S upper manifolds include the upper manifold, where S is an integer greater than one; and
T lower manifolds defined in the second body, wherein the T lower manifolds include the lower manifold, where T is an integer greater than one.

9. A cooling grid assembly of claim 8, wherein:
one-half of the S upper manifolds are located on one side of the first body;
one-half of the S upper manifolds are located on an opposite side of the first body;
one-half of the T lower manifolds are located on one side of the second body; and
one-half of the T lower manifolds are located on an opposite side of the second body.

10. A substrate processing system, comprising:
the cooling grid assembly of claim 1; and
a faceplate that includes a hole pattern including a plurality of holes and that is arranged adjacent to the second portion of the cooling grid assembly.

11. The substrate processing system of claim 10, wherein the plurality of tubes of the cooling grid assembly is made of aluminum and the faceplate is made of quartz.

12. The substrate processing system of claim 10, wherein the plurality of tubes have a circular cross-section.

13. The substrate processing system of claim 10, wherein the plurality of tubes have an elliptical cross-section.

14. The substrate processing system of claim 13, wherein the elliptical cross-section has a minor axis that is parallel to a plane including the plurality of tubes.

15. The substrate processing system of claim 10, wherein the substrate processing system performs ashing.

16. The substrate processing system of claim 10, wherein the substrate processing system performs film deposition.

17. The substrate processing system of claim 10, wherein the substrate processing system performs etching.

18. A substrate processing system, comprising:
a plurality of the cooling grid assemblies of claim 1; and
a faceplate that includes a hole pattern including a plurality of holes and that is arranged adjacent to the second portion of one of the plurality of the cooling grid assemblies.

19. The substrate processing system of claim 18, wherein the plurality of the cooling grid assemblies are arranged in alignment with one another.

20. The substrate processing system of claim 18, wherein the plurality of the cooling grid assemblies are rotated relative to one another.

21. The substrate processing system of claim 18, wherein at least one of the plurality of the cooling grid assemblies has a different tube spacing or a different tube diameter than another one of the plurality of the cooling grid assemblies.

22. A cooling grid assembly for a substrate processing system, comprising:
a first portion including:
a first body defining a central opening;
S upper manifolds defined in the first body, where S is an even integer greater than one; and
a second portion arranged adjacent to the first portion and including:
a second body defining a central opening;
T lower manifolds defined in the second body, where T is an even integer greater than one,
a plurality of tubes arranged in the central opening of the second body, wherein first ones of the plurality of tubes are in fluid communication with the S upper manifolds, and wherein second ones of the plurality of tubes are in fluid communication with the T lower manifolds;
an inlet and an outlet fluidly connected to each pair of the S upper manifolds and each pair of the T lower manifolds; and
wherein the grid assembly is arranged between a remote plasma source and a substrate.

23. The cooling grid assembly of claim 22, wherein:
one-half of the S upper manifolds are located on one side of the first body;
one-half of the S upper manifolds are located on an opposite side of the first body;
one-half of the T lower manifolds are located on one side of the second body; and
one-half of the T lower manifolds are located on an opposite side of the second body.

24. A substrate processing system, comprising:
the cooling grid assembly of claim 22; and
a faceplate that includes a hole pattern including a plurality of holes and that is arranged adjacent to the second portion of the cooling grid assembly.

25. The substrate processing system of claim 24, wherein the plurality of tubes of the cooling grid assembly is made of aluminum and the faceplate is made of quartz.

26. The substrate processing system of claim 24, wherein the plurality of tubes have a circular cross-section.

27. The substrate processing system of claim 24, wherein the plurality of tubes have an elliptical cross-section.

28. The substrate processing system of claim 27, wherein the elliptical cross-section has a minor axis that is parallel to a plane including the plurality of tubes.

29. The substrate processing system of claim 24, wherein the substrate processing system performs ashing.

30. The substrate processing system of claim 24, wherein the substrate processing system performs film deposition.

31. The substrate processing system of claim 24, wherein the substrate processing system performs etching.

32. A substrate processing system, comprising:
a plurality of the cooling grid assemblies of claim 22; and a faceplate that includes a hole pattern including a plurality of holes and that is arranged adjacent to the second portion of one of the plurality of the cooling grid assemblies.

33. The substrate processing system of claim 32, wherein the plurality of the cooling grid assemblies are arranged in alignment with one another.

34. The substrate processing system of claim 32, wherein the plurality of the cooling grid assemblies are rotated relative to one another.

35. The substrate processing system of claim 32, wherein at least one of the plurality of the cooling grid assemblies has a different tube spacing or a different tube diameter than another one of the plurality of the cooling grid assemblies.

* * * * *